US012322652B2

(12) United States Patent
Wu et al.

(10) Patent No.: US 12,322,652 B2
(45) Date of Patent: Jun. 3, 2025

(54) LOCAL INTERCONNECT FOR CROSS COUPLING

(71) Applicant: INTERNATIONAL BUSINESS MACHINES CORPORATION, Armonk, NY (US)

(72) Inventors: Heng Wu, Santa Clara, CA (US); Ruilong Xie, Niskayuna, NY (US); Albert M. Chu, Nashua, NH (US); Albert M. Young, Fishkill, NY (US); Junli Wang, Slingerlands, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 17/662,436

(22) Filed: May 9, 2022

(65) Prior Publication Data

US 2023/0360971 A1 Nov. 9, 2023

(51) Int. Cl.
*H01L 21/768* (2006.01)
*H01L 23/00* (2006.01)
(Continued)

(52) U.S. Cl.
CPC .. *H01L 21/76895* (2013.01); *H01L 21/76897* (2013.01); *H01L 23/481* (2013.01);
(Continued)

(58) Field of Classification Search
CPC ......... H01L 21/76895; H01L 21/76897; H01L 23/481; H01L 24/29; H01L 24/32;
(Continued)

(56) References Cited

U.S. PATENT DOCUMENTS

| 5,888,853 A | * | 3/1999 | Gardner | ............ H01L 21/02532 257/E21.415 |
| 10,192,867 B1 | | 1/2019 | Frougier | |

(Continued)

FOREIGN PATENT DOCUMENTS

WO   WO-2020170067 A1 * 8/2020 ........... G11C 11/408

OTHER PUBLICATIONS https://www.imec-int.com/en/articles/view-logic-technology-roadmap, "A view on the logic technology roadmap", IMEC, Accessed on Feb. 17, 2022, pp. 1-49.

(Continued)

*Primary Examiner* — Joshua Benitez Rosario
*Assistant Examiner* — Moataz Khalifa
(74) *Attorney, Agent, or Firm* — Yuanmin Cai

(57) ABSTRACT

Embodiments of present invention provide a transistor structure. The transistor structure includes a first and a second transistor in a first transistor layer; a first and a second transistor in a second transistor layer, respectively, above the first and the second transistor in the first transistor layer; a metal routing layer between the first transistor layer and the second transistor layer; a first local interconnect connecting the first transistor of the first transistor layer to the metal routing layer; and a second local interconnect connecting the metal routing layer to the second transistor of the second transistor layer. A method of manufacturing the transistor structure is also provided.

20 Claims, 13 Drawing Sheets

(51) Int. Cl.
*H01L 23/48* (2006.01)
*H10D 64/01* (2025.01)
*H10D 64/23* (2025.01)

(52) U.S. Cl.
CPC ............ *H10D 64/258* (2025.01); *H01L 24/29* (2013.01); *H01L 24/32* (2013.01); *H01L 2224/29187* (2013.01); *H01L 2224/32145* (2013.01); *H10D 64/01* (2025.01)

(58) Field of Classification Search
CPC ......... H01L 29/401; H01L 2224/32145; H01L 21/8221; H01L 27/088; H01L 27/0688; H01L 29/66545; H01L 29/78
See application file for complete search history.

(56) References Cited

U.S. PATENT DOCUMENTS

| | | | |
|---|---|---|---|
| 10,256,158 | B1 | 4/2019 | Frougier |
| 10,658,385 | B2 | 5/2020 | Becker |
| 10,734,383 | B2 | 8/2020 | Smayling |
| 10,998,270 | B2 | 5/2021 | Sung |
| 2023/0170243 | A1* | 6/2023 | Or-Bach ............ H01L 21/6835 438/129 |

OTHER PUBLICATIONS

Macha et al., "New 3-D CMOS Fabric with Stacked Horizontal Nanowires", IEEE Transactions on Computer-Aided Design of Integrated Circuits and Systems, vol. 38, No. 9, Sep. 2019, pp. 1625-1634.

Yoo et al., "Highly stacked 3D organic integrated circuits with via-hole-less multilevel metal interconnects", Nature communications, 2019, pp. 1-9.

* cited by examiner

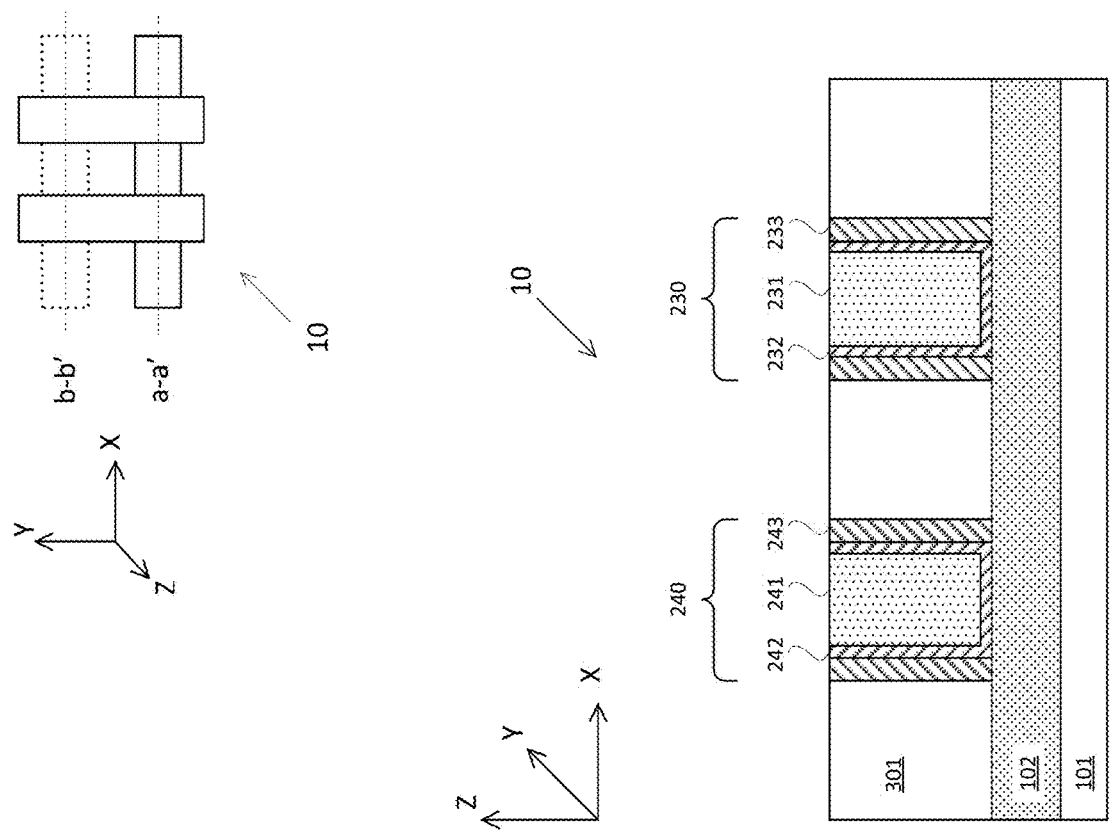
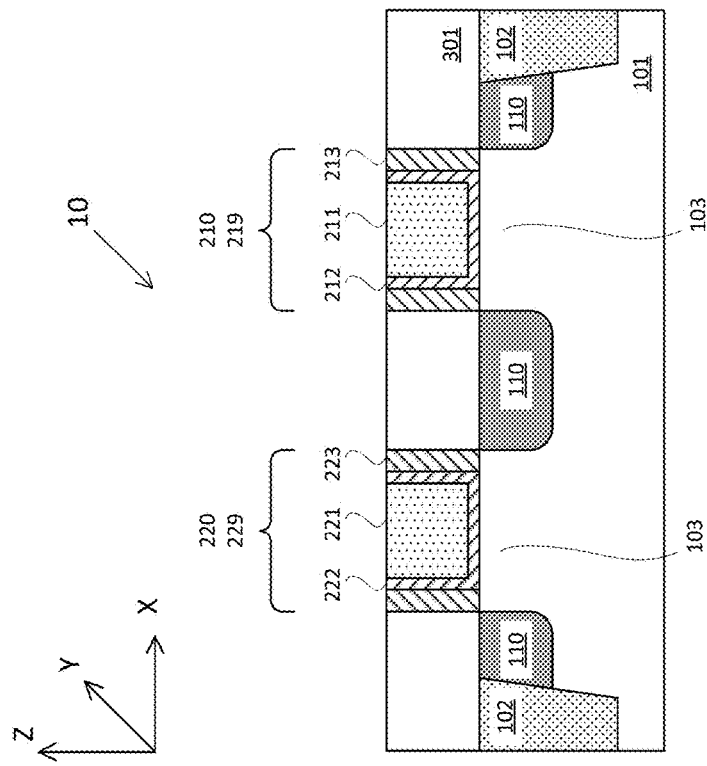
FIG. 1B
FIG. 1A

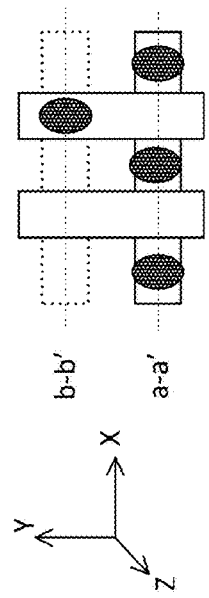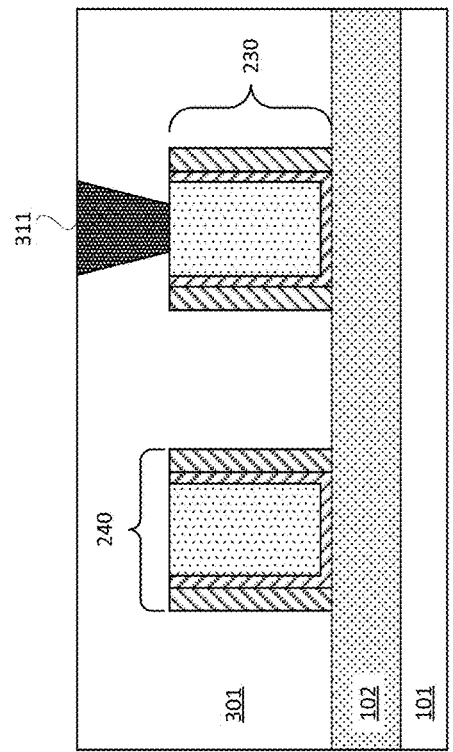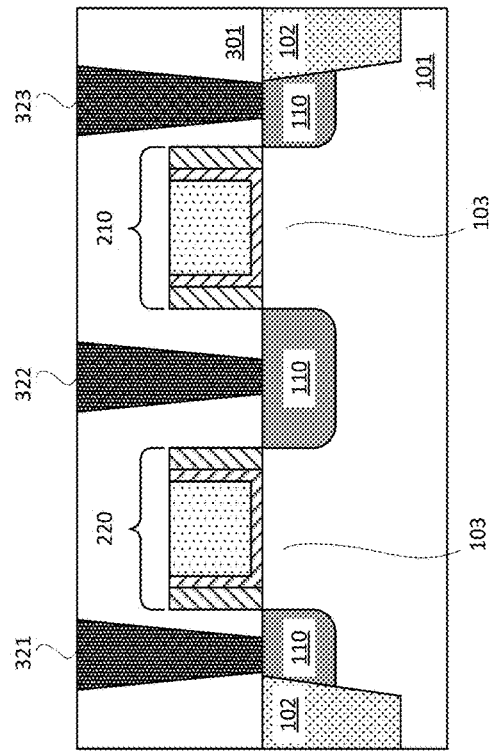
FIG. 2A
FIG. 2B

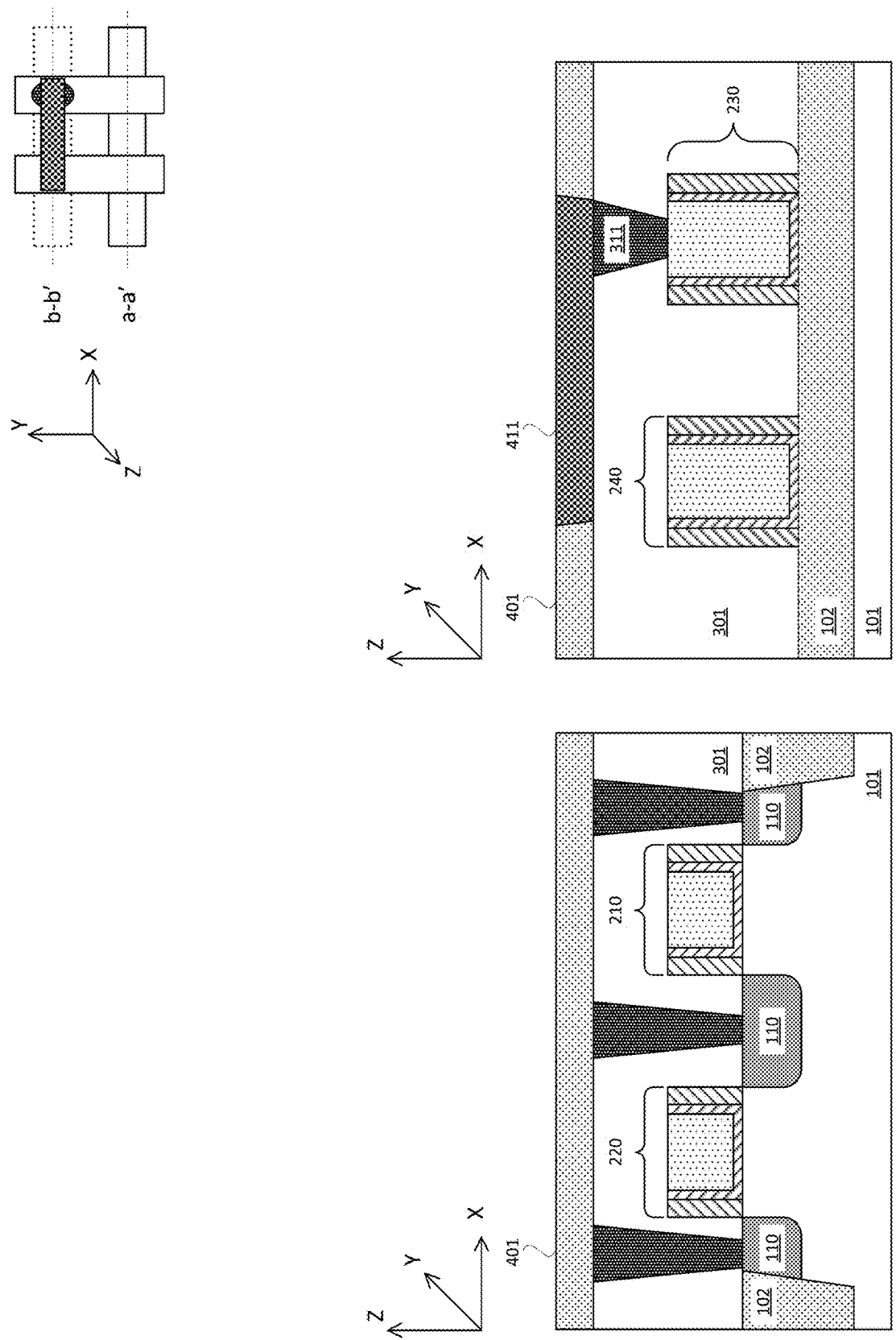

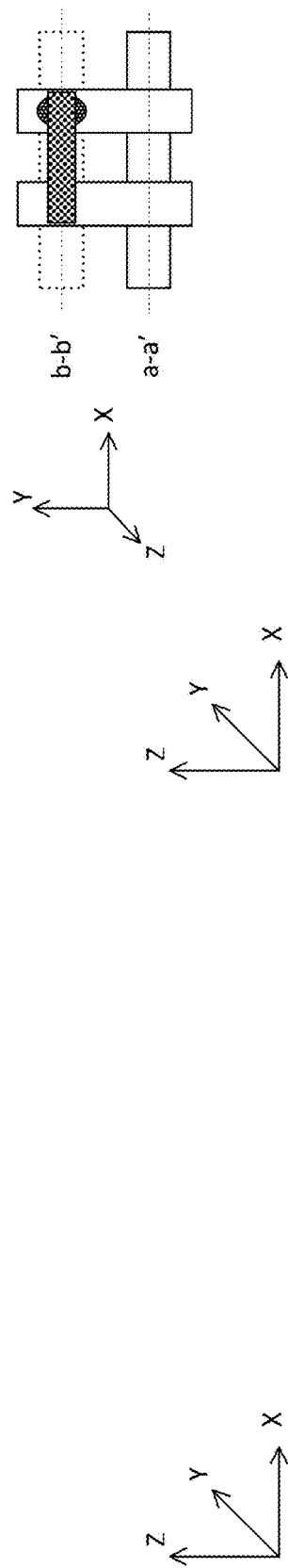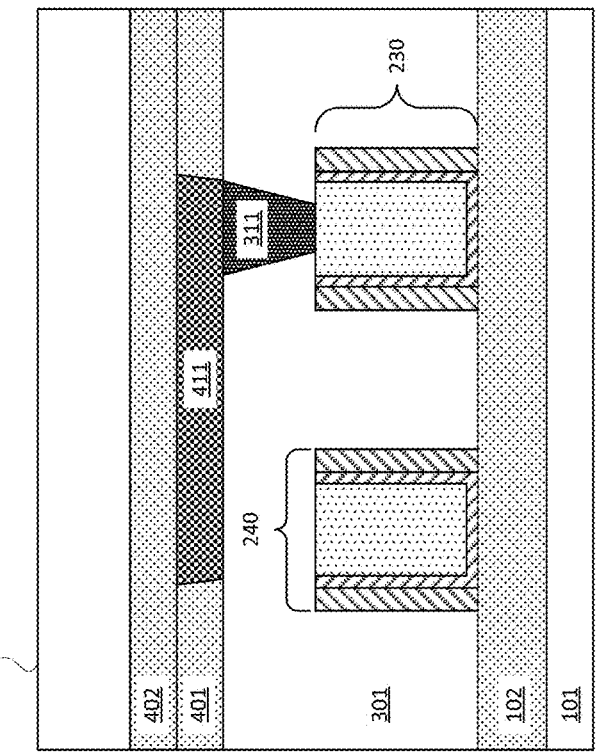
FIG. 4B
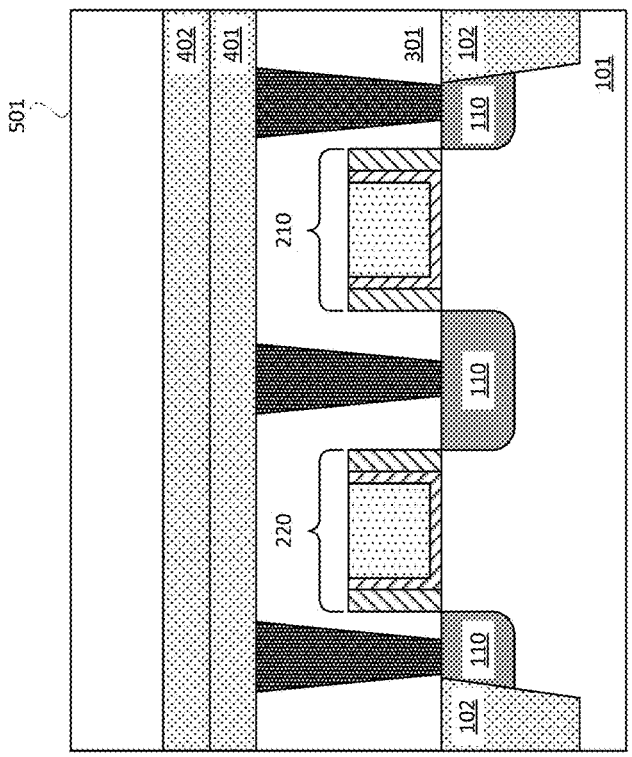
FIG. 4A

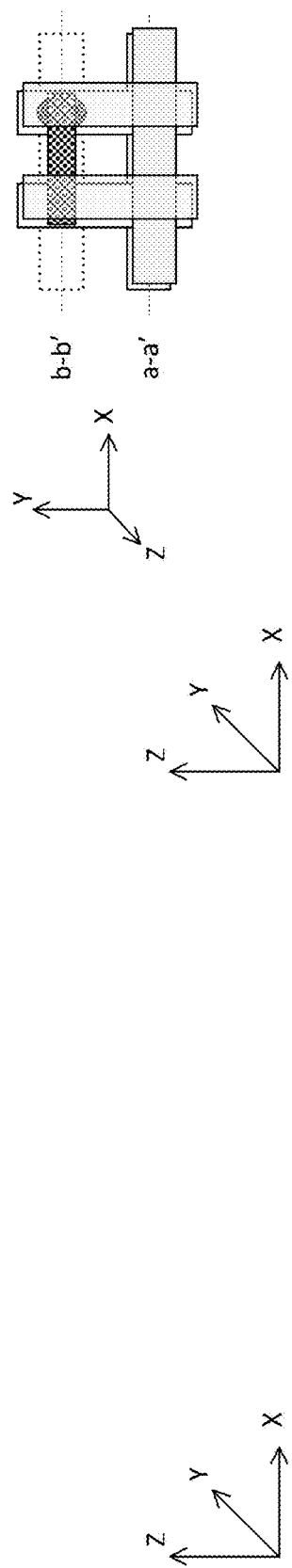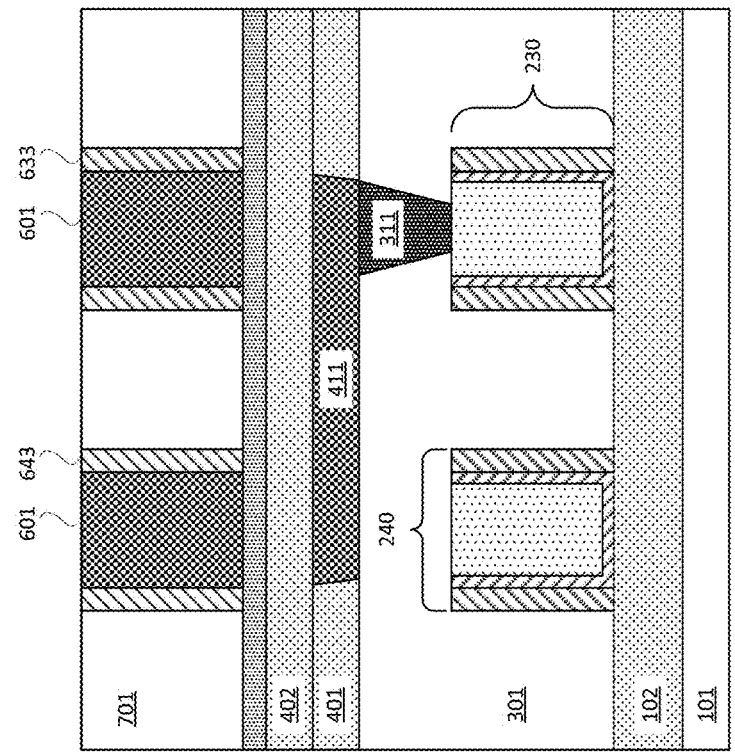
FIG. 5B
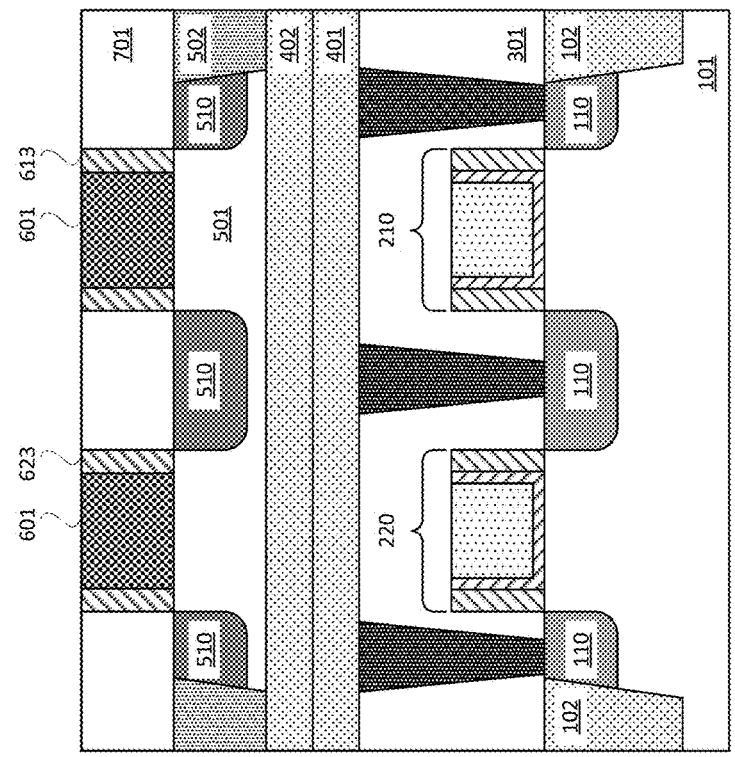
FIG. 5A

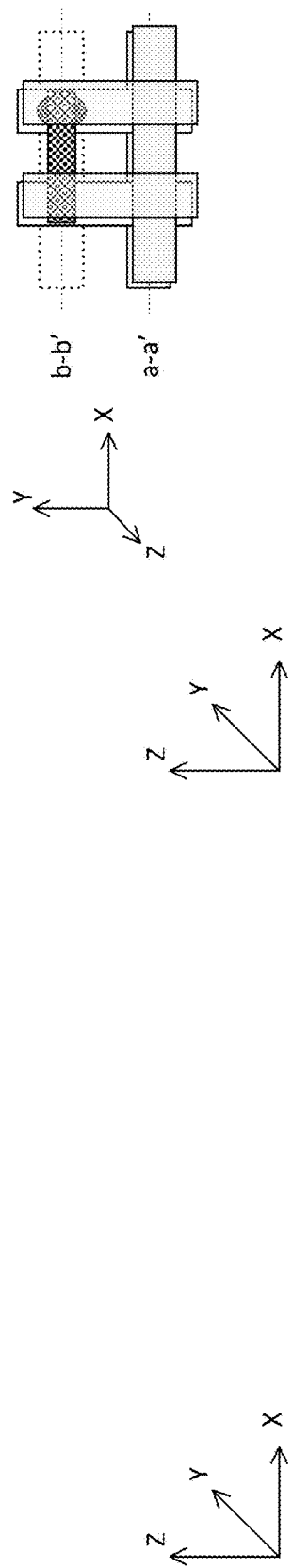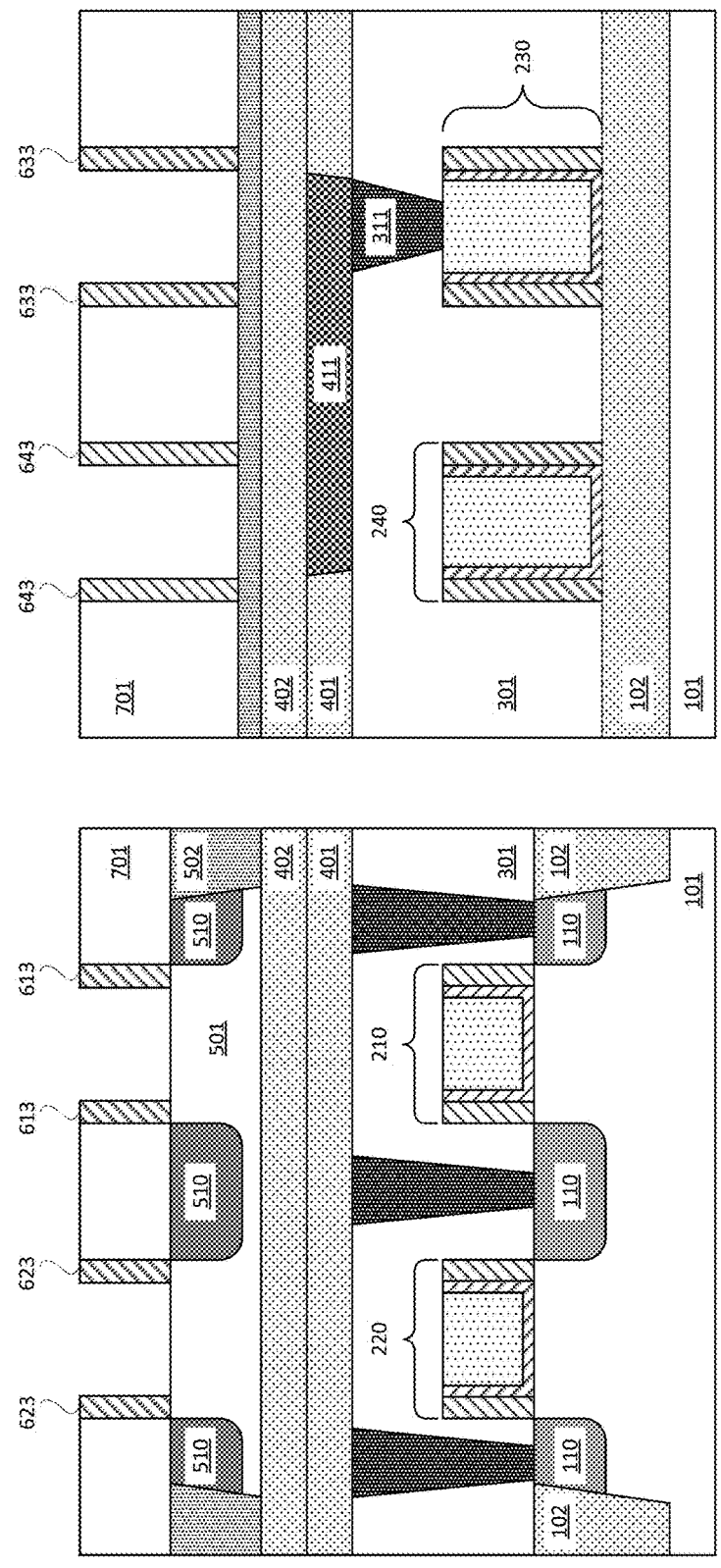
FIG. 6B
FIG. 6A

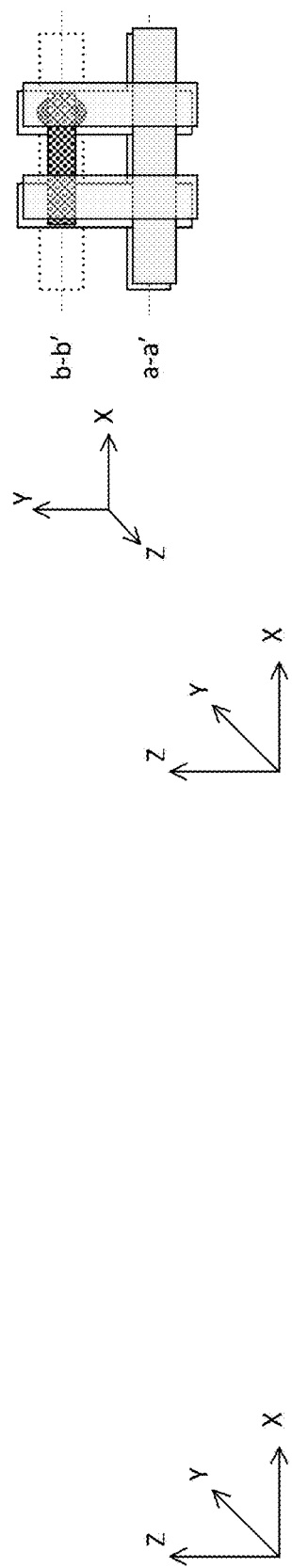
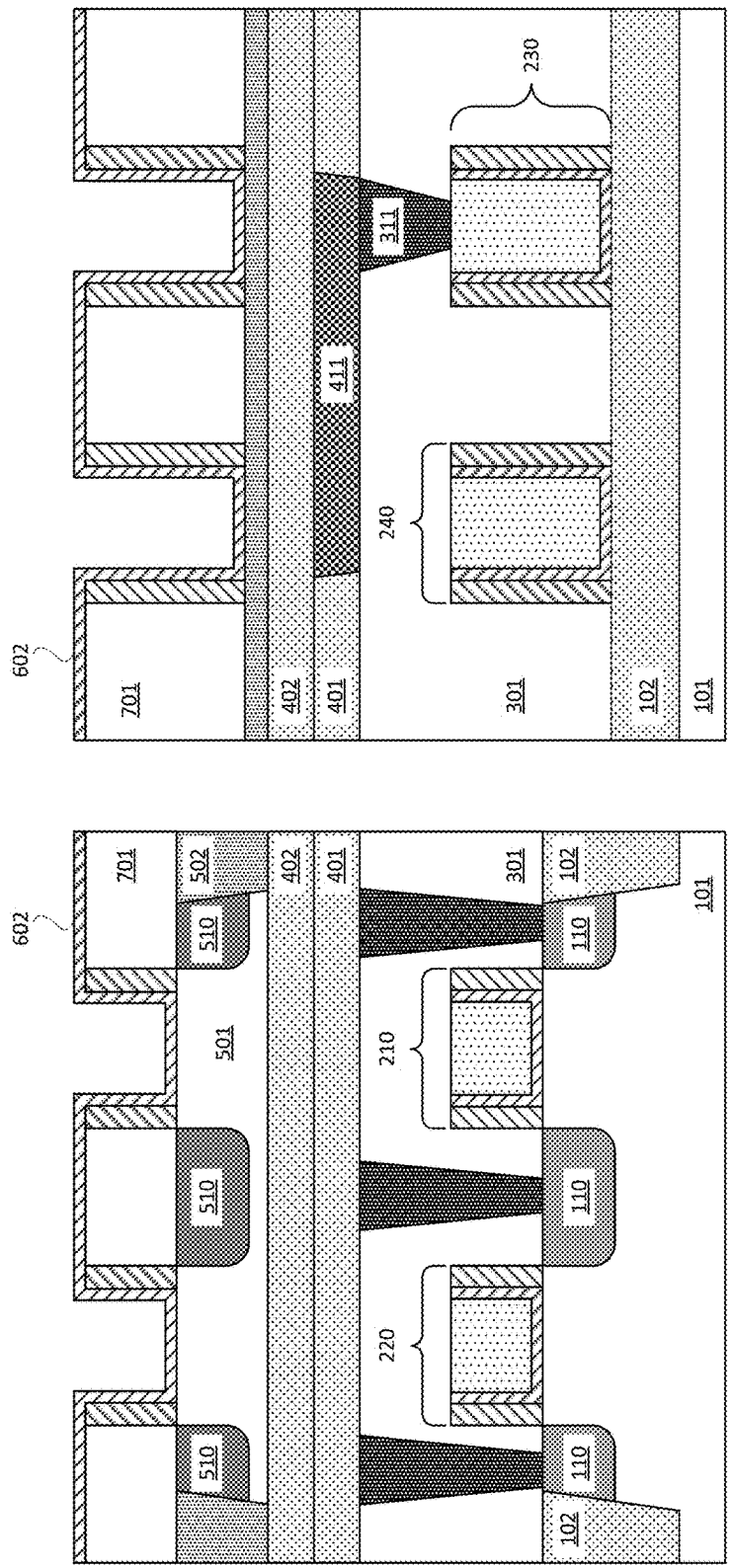
FIG. 7A
FIG. 7B

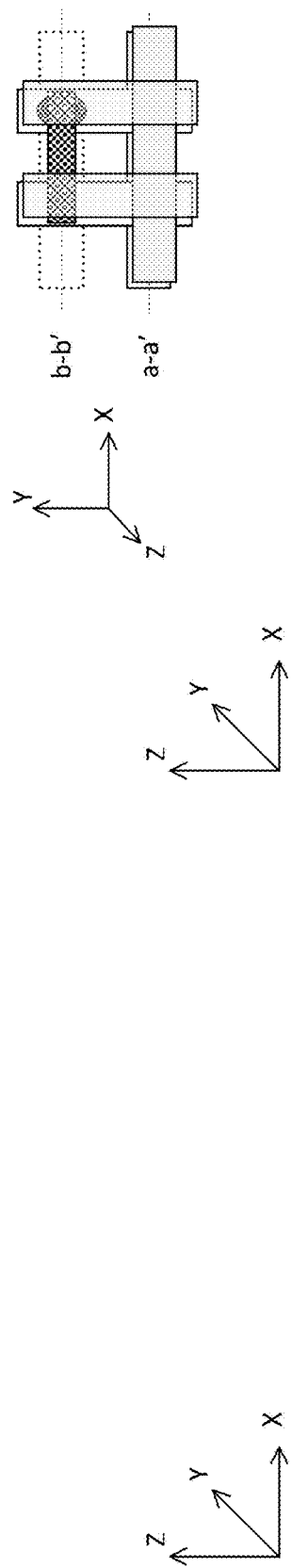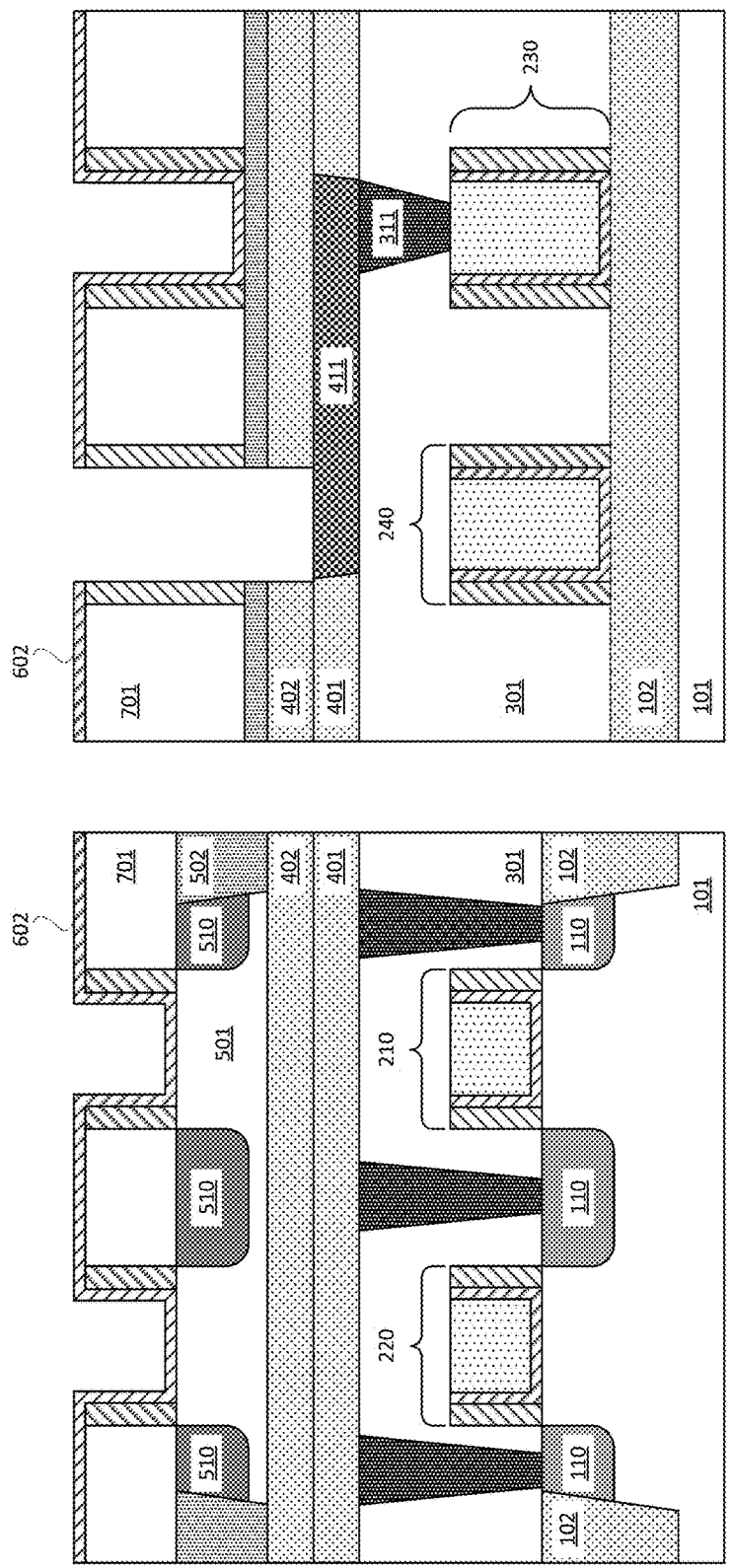
FIG. 10B
FIG. 10A

LOCAL INTERCONNECT FOR CROSS COUPLING

BACKGROUND

The present application relates to manufacturing of semiconductor integrated circuits. More particularly, it relates to a local interconnect for cross coupling and method of manufacturing the same.

Local interconnect plays a critical role in the scaling of semiconductor devise. Local interconnect provides cross-coupling among transistors to form a functional transistor device such as, for example, a scan D-flip flop, by connecting a gate of an n-type transistor to a gate of an adjacent CPP (contacted poly pitch) p-type transistor.

For a design using non-stacked transistors, there are several options to form this cross-coupling depending on design rule limitations. The cross-coupling may generally be achieved in 2 CPP. On the other hand, forming cross-coupling for stacked transistors such as between a gate of a lower-level n-type transistor and a gate of an adjacent CPP upper-level p-type transistor, using currently existing art, comes with area penalty due to the necessity to increase either cell width and/or cell height. It is estimated that in some instances an area penalty of up to 15% may incur in order to accommodate the formation of cross-coupling.

SUMMARY

Embodiments of present invention provide a transistor structure. The transistor structure includes a first transistor in a first transistor layer; a second transistor in a second transistor layer, the second transistor layer being above the first transistor layer and separated from the first transistor layer by an intermediate layer; a metal routing layer between the first transistor layer and the second transistor layer; a first local interconnect connecting the first transistor to the metal routing layer; and a second local interconnect connecting the metal routing layer to the second transistor.

In accordance with one embodiment, the intermediate layer includes a dielectric layer formed on top of the first transistor layer and an oxide bonding layer bonding the second transistor layer to the dielectric layer. In one embodiment, the metal routing layer is embedded in the dielectric layer underneath the oxide bonding layer.

In accordance with another embodiment, the first local interconnect connects a gate metal of the first transistor to the metal routing layer, and the second local interconnect connects the metal routing layer to a gate metal of the second transistor.

In accordance with yet another embodiment, the second transistor is not vertically directly above the first transistor and is horizontally offset from the first transistor.

Embodiments of present invention provide a method of forming a transistor structure. The method includes forming a first transistor in a first transistor layer; forming a dielectric layer above the first transistor layer; forming a metal routing layer in the dielectric layer, the metal routing layer being connected to a gate metal of the first transistor; bonding a second transistor layer to the dielectric layer by an oxide bonding layer; forming a second transistor in the second transistor layer, a gate metal of the second transistor being connected to the metal routing layer.

BRIEF DESCRIPTION OF THE DRAWINGS

The present invention will be understood and appreciated more fully from the following detailed description of embodiments of present invention, taken in conjunction with accompanying drawings of which:

FIGS. 1A and 1B are demonstrative illustrations of cross-sectional views of a transistor structure in a step of manufacturing thereof according to one embodiment of present invention;

FIGS. 2A and 2B are demonstrative illustrations of cross-sectional views of a transistor structure in a step, following the step illustrated in FIGS. 1A and 1B, of manufacturing thereof according to one embodiment of present invention;

FIGS. 3A and 3B are demonstrative illustrations of cross-sectional views of a transistor structure in a step, following the step illustrated in FIGS. 2A and 2B, of manufacturing thereof according to one embodiment of present invention;

FIGS. 4A and 4B are demonstrative illustrations of cross-sectional views of a transistor structure in a step, following the step illustrated in FIGS. 3A and 3B, of manufacturing thereof according to one embodiment of present invention;

FIGS. 5A and 5B are demonstrative illustrations of cross-sectional views of a transistor structure in a step, following the step illustrated in FIGS. 4A and 4B, of manufacturing thereof according to one embodiment of present invention;

FIGS. 6A and 6B are demonstrative illustrations of cross-sectional views of a transistor structure in a step, following the step illustrated in FIGS. 5A and 5B, of manufacturing thereof according to one embodiment of present invention;

FIGS. 7A and 7B are demonstrative illustrations of cross-sectional views of a transistor structure in a step, following the step illustrated in FIGS. 6A and 6B, of manufacturing thereof according to one embodiment of present invention;

FIGS. 10A and 10B are demonstrative illustrations of cross-sectional views of a transistor structure in a step, following the step illustrated in FIGS. 9A and 9B, of manufacturing thereof according to one embodiment of present invention;

Figures 8A, 8B:
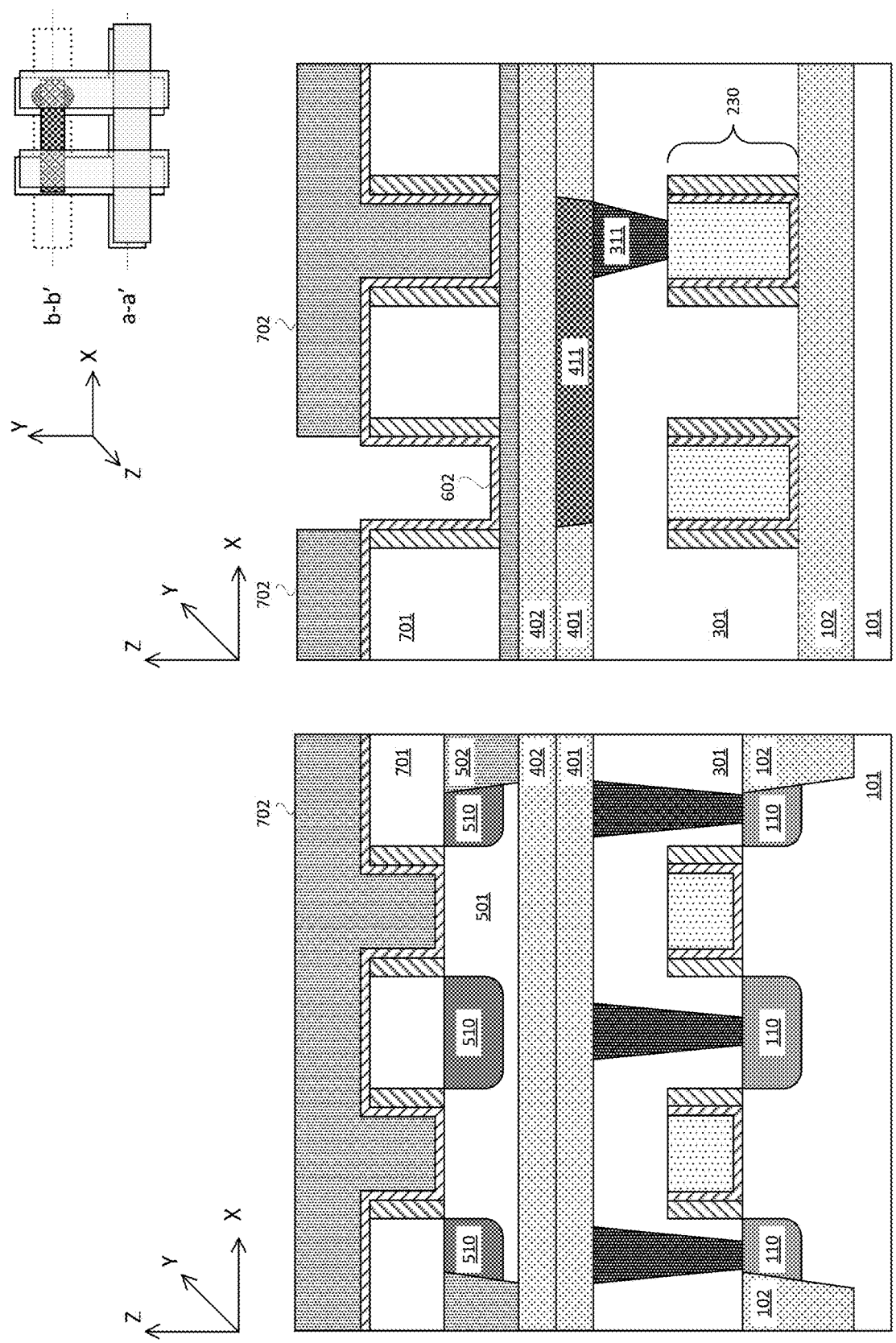
FIGS. 8A and 8B are demonstrative illustrations of cross-sectional views of a transistor structure in a step, following the step illustrated in FIGS. 7A and 7B, of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures. To provide spatial context to the different structural orientations of the semiconductor structures shown in the drawings, XYZ Cartesian coordinates may be shown in one or more of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Moreover, the same or similar reference numbers are used throughout the drawings to denote the same or similar features, elements, or structures, and thus, a detailed explanation of the same or similar features, elements, or structures may not be repeated for each of the drawings for economy of description.

FIGS. 1A and 1B are demonstrative illustrations of cross-sectional views of a transistor structure during a process of manufacturing thereof, according to some embodiments of present invention.

More specifically, FIGS. 1A and 1B demonstratively illustrate cross-sectional views of a transistor structure 10 along dashed lines a-a' and b-b' respectively. Dashed lines a-a' and b-b' are provided in a simplified top view of transistor structure 10 at the upper-right corner of the drawing. Cross-sectional view along dashed line a-a' is taken across the active region of the device (including source/drain regions and gate in an across-gate direction), and cross-sectional view along dashed line b-b' is taken outside the active region of the device in the across-gate direction, and the gate is formed over a shallow trench isolation (STI) region 102 as well.

FIGS. 2A and 2B to FIGS. 12A and 12B, as being described below in more details, provide cross-sectional reviews of transistor structure 10 at various manufacturing stages in a manner similar to FIGS. 1A and 1B. In other words, drawings labeled with a same suffix "A" or "B" denote a same cross-sectional view of transistor structure 10 at various manufacturing stages. Although various reference numerals may be used across different drawings, same or similar reference numerals may be used in referring to same or similar elements in different drawings. Labelling for the same or similar elements in some drawings may be omitted in order not to overcrowd the drawings.

Hereinafter, FIGS. 1A and 1B may be collectively referred to as FIG. 1. Similarly, FIGS. 2A and 2B may be collectively referred to as FIG. 2. So are rest of drawings including FIGS. 3A and 3B to FIGS. 12A to 12B that may be collectively referred to as FIG. 3 to FIG. 12, respectively.

In the above, and hereinafter, fin-type transistors will be used to demonstratively illustrate the manufacturing process of transistor structure 10. However, the use of fin-type transistors is merely illustrative. Embodiments of present invention are not limited to fin-type transistors. For example, embodiments of present invention may be similarly applied to forming transistor structures of other types of transistors such as, for example, nanosheet transistors, nanowire transistors, vertical transistors (VFET), and/or planar transistors, as a person skilled in the art will readily appreciate.

FIGS. 1A and 1B are demonstrative illustrations of cross-sectional views of a transistor structure in a step of manufacturing thereof according to one embodiment of present invention. More specifically, FIG. 1A illustrates a cross-sectional view of transistor structure 10 in an across-gate direction. The transistor structure 10 may include a substrate 101 and a fin-shaped channel region 103 formed on top of the substrate 101. The substrate 101 may be a bulk silicon (Si) substrate, a silicon-on-insulator (SOI) substrate, a silicon-germanium-on-insulator (SGOI) substrate, or any other suitable substrate material.

A first transistor 219 and a second transistor 229 may be formed in a first transistor layer. The first transistor 219 may include a first gate 210. The first gate 210 may include sidewall spacers 213, a gate dielectric 212 that lines a channel region 103 and sidewall spacers 213, and a gate metal 211 filling the space between the gate dielectric 212. Source/drain regions 110 may be formed next to the channel region 103, and STI regions 102 may be formed on top of the substrate 101 and surrounding the first and second transistors 219 and 229. The second transistor 229 may include a second gate 220. The second gate 220 may include sidewall spacers 223, a gate dielectric 222 that lines a channel region 103 and sidewall spacers 223, and a gate metal 221 filling the space between the gate dielectric 222.

As being demonstratively illustrated in FIG. 1B, the first gate 210 of the first transistor 219 may extend to a region away from the channel region 103 to have an extended gate structure 230. Similarly, the second gate 220 of the second transistor 229 may extend to a region away from the channel region 103 to have an extended gate structure 240. More specifically, the extended gate structure 230 may include sidewall spacers 233, a gate dielectric 232 lining the sidewall spacers 233 and directly on top of the STI region 102, and a gate metal 231 filling a space between the gate dielectric 232. The gate metal 231 may be the same as the gate metal 211 of the first gate 210. Similarly, the extended gate structure 240 may include sidewall spacers 243, a gate dielectric 242 lining the sidewall spacers 243 and directly on top of the STI region 102, and a gate metal 241 filling a space between the gate dielectric 242. The gate metal 241 may be the same as the gate metal 221 of the second gate 220. The first gate 210 and its extended gate structure 230 and the second gate 220 and its extended gate structure 240 may be embedded in a dielectric layer 301, having a co-planar top surface.

FIGS. 2A and 2B are demonstrative illustrations of cross-sectional views of a transistor structure in a step, following the step illustrated in FIGS. 1A and 1B, of manufacturing thereof according to one embodiment of present invention. More specifically, embodiments of present invention provide forming additional dielectric layer 301 over the first gate 210 of the first transistor 219; the second gate 220 of the second transistor 229; the extended gate structure 230; and the extended gate structure 240. Source/drain contacts 321, 322, and 323 to the first and second transistors 219 and 229 may be formed and a first local interconnect 311 may be formed to contact the gate metal 231 of the extended gate structure 230. By the nature that the gate metal 231 of the extended gate structure 230 is the same as the gate metal 211 of the first gate 210, the first local interconnect 311 may thereby be in contact with the first gate 210 of the first transistor 219.

FIGS. 3A and 3B are demonstrative illustrations of cross-sectional views of a transistor structure in a step, following the step illustrated in FIGS. 2A and 2B, of manufacturing thereof according to one embodiment of present invention. More particularly, embodiments of present invention provide depositing a dielectric layer 401, such as a silicon-oxide (SiO) or silicon-nitride (SiN) layer, on top of the dielectric layer 301 and forming a metal routing layer 411 in direct contact with the first local interconnect 311. The metal routing layer 411 may be made of, for example, tungsten (W), cobalt (Co), ruthenium (Ru), and/or copper (Cu) although other conductive materials may be used as well. The metal routing layer 411 may be made to have a length extending from the above of the extended gate structure 230 to the above of the extended gate structure 240. As can be understood from the simplified top view, the metal routing layer 411 does not overlap, vertically along the Z-direction, with the first transistor 219 and the second transistor 229. The metal routing layer 411 illustrated in FIG. 3B is separated, horizontally along the Y-direction, from the first and second transistors 219 and 229 illustrated in FIG. 3A.

FIGS. 4A and 4B are demonstrative illustrations of cross-sectional views of a transistor structure in a step, following the step illustrated in FIGS. 3A and 3B, of manufacturing thereof according to one embodiment of present invention. More particularly, embodiments of present invention provide bonding a wafer with a substrate 501 on top of the first and second transistors 219 and 229 of the first transistor layer such that additional transistors may be formed in a second transistor layer. For example, using a bonding agent such as an oxide bonding layer 402, substrate 501 may be bonded directly onto the dielectric layer 401 and on top of the metal routing layer 411.

FIGS. 5A and 5B are demonstrative illustrations of cross-sectional views of a transistor structure in a step, following the step illustrated in FIGS. 4A and 4B, of manufacturing thereof according to one embodiment of present invention. More particularly, embodiments of present invention provide patterning the substrate 501 into a fin-shaped form in a region directly above the first and second transistors 219 and 229 of the first transistor layer which, in one embodiment, removes the substrate 501 from a region above the extended gate structure 230 and the extended gate structure 240. An optional shallow-trench-isolation (STI) layer 502 may be formed next to and surrounding fin-shaped substrate 501 and may be formed directly on top of the oxide bonding layer 402 in regions away from the fin-shaped substrate 501 such as in a region above the extended gate structure 230 and the extended gate structure 240.

Embodiments of present invention may subsequently form sacrificial gates 601 of polysilicon, for example, on top of the fin-shaped substrate 501 and forming sidewall spacers 613, 623, 633, and 643 against sidewalls of the sacrificial gates 601. Next, source/drain regions 510 may be formed between the sacrificial gates 601. A dielectric layer 701 may be deposited on top of the sacrificial gates 601 and subsequently planarized to expose a top surface of the sacrificial gates 601 for a further replacement-metal-gate (RMG) processing.

FIGS. 6A and 6B are demonstrative illustrations of cross-sectional views of a transistor structure in a step, following the step illustrated in FIGS. 5A and 5B, of manufacturing thereof according to one embodiment of present invention. More particularly, embodiments of present invention provide selectively removing the sacrificial gates 601 as a step of the RMG process, which then exposes a channel region in the fin-shaped substrate 501 and sidewall spacers 613 and 623. The removal of the sacrificial gates 601 also creates openings surrounded by the sidewall spacers 633 and 643 in a region away from the channel region of the substrate 501 and directly above the extended gate structure 230 and the extended gate structure 240.

FIGS. 7A and 7B are demonstrative illustrations of cross-sectional views of a transistor structure in a step, following the step illustrated in FIGS. 6A and 6B, of manufacturing thereof according to one embodiment of present invention. More particularly, embodiments of present invention provide lining the openings between the sidewall spacers 613, 623, 633, and 643 with a gate dielectric layer 602, e.g., high-k dielectric such as $HfO_2$, $ZrO_2$, HfLaOx, HfAlOx, etc. Depending upon the types of transistors to be formed in the second transistor layer, in one embodiment, different sets of high-k gate dielectric may be formed inside opening between the sidewall spacers 613 and inside opening between the sidewall spacers 623.

FIGS. 8A and 8B are demonstrative illustrations of cross-sectional views of a transistor structure in a step, following the step illustrated in FIGS. 7A and 7B, of manufacturing thereof according to one embodiment of present invention. More particularly, embodiments of present invention provide forming a mask layer 702, e.g., OPL, through a lithographic patterning process. The mask layer 702 covers openings between the sidewall spacers 613, 623, and 633 and leaves the opening between the sidewall spacers 643 and the gate dielectric layer 602 exposed. Embodiments of present invention may then proceed to form a second local interconnect in this opening as being described below in more details.

Figures 9A, 9B:
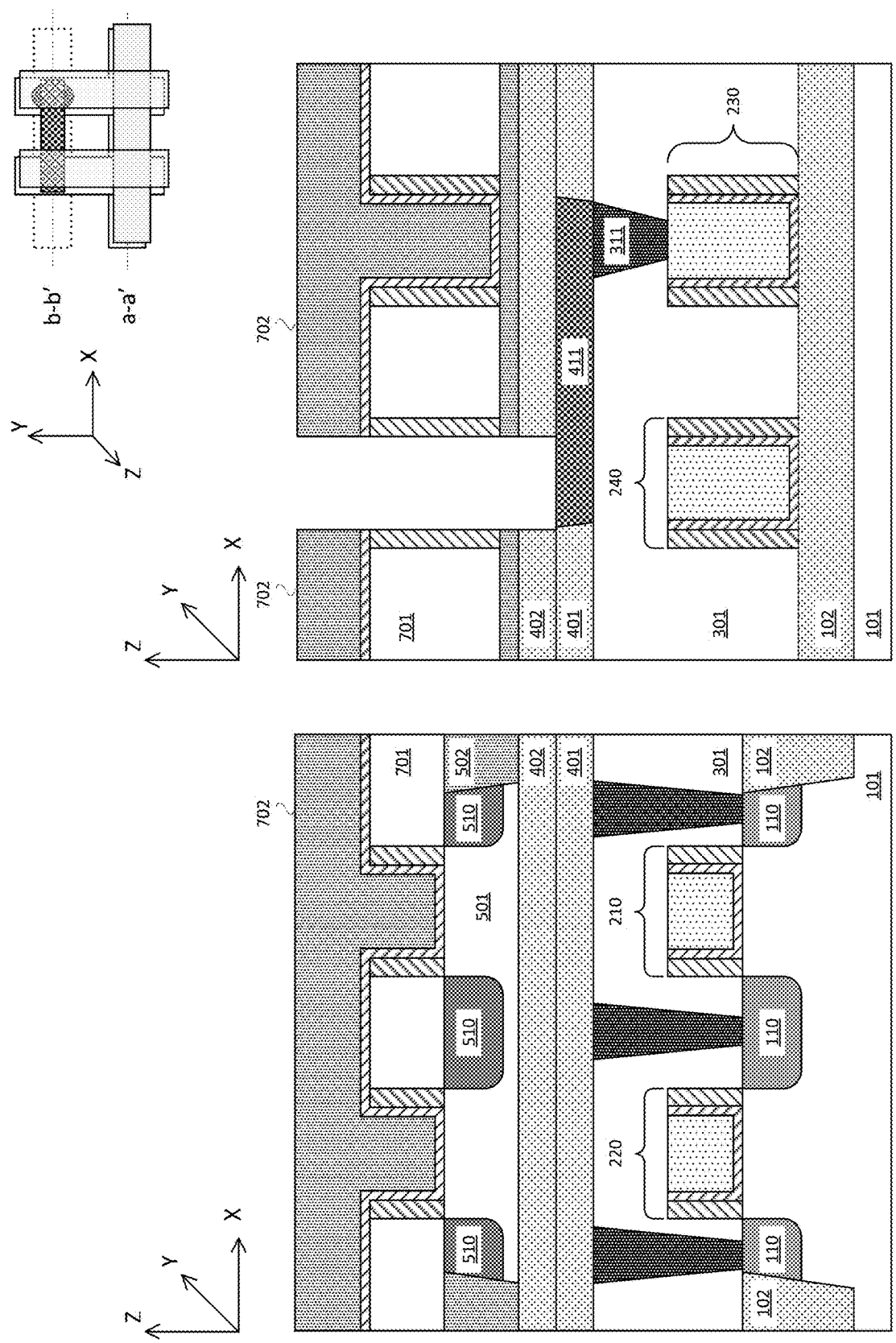
FIGS. 9A and 9B are demonstrative illustrations of cross-sectional views of a transistor structure in a step, following the step illustrated in FIGS. 8A and 8B, of manufacturing thereof according to one embodiment of present invention.

FIGS. 9A and 9B are demonstrative illustrations of cross-sectional views of a transistor structure in a step, following the step illustrated in FIGS. 8A and 8B, of manufacturing thereof according to one embodiment of present invention. More particularly, embodiments of present invention provide performing a selective etching process to remove the gate dielectric layer 602 lining the opening between the sidewall spacers 643, which is followed by a reactive-ion-etching (RIE) process that removes, through the opening, a portion of the STI layer 502 and a portion of the dielectric layer 402 exposed by the opening. The removal of portion of the STI layer 502 and underneath dielectric layer 402 exposes a portion of the metal routing layer 411.

FIGS. 10A and 10B are demonstrative illustrations of cross-sectional views of a transistor structure in a step, following the step illustrated in FIGS. 9A and 9B, of manufacturing thereof according to one embodiment of present invention. More particularly, once the metal routing layer 411 is exposed through the opening between the sidewall spacers 643, the mask layer 702 may be selectively removed at least from the openings between the sidewall spacers 613 and 623 in preparation for forming metal gate for transistors of the second transistor layer.

Figure 11B:
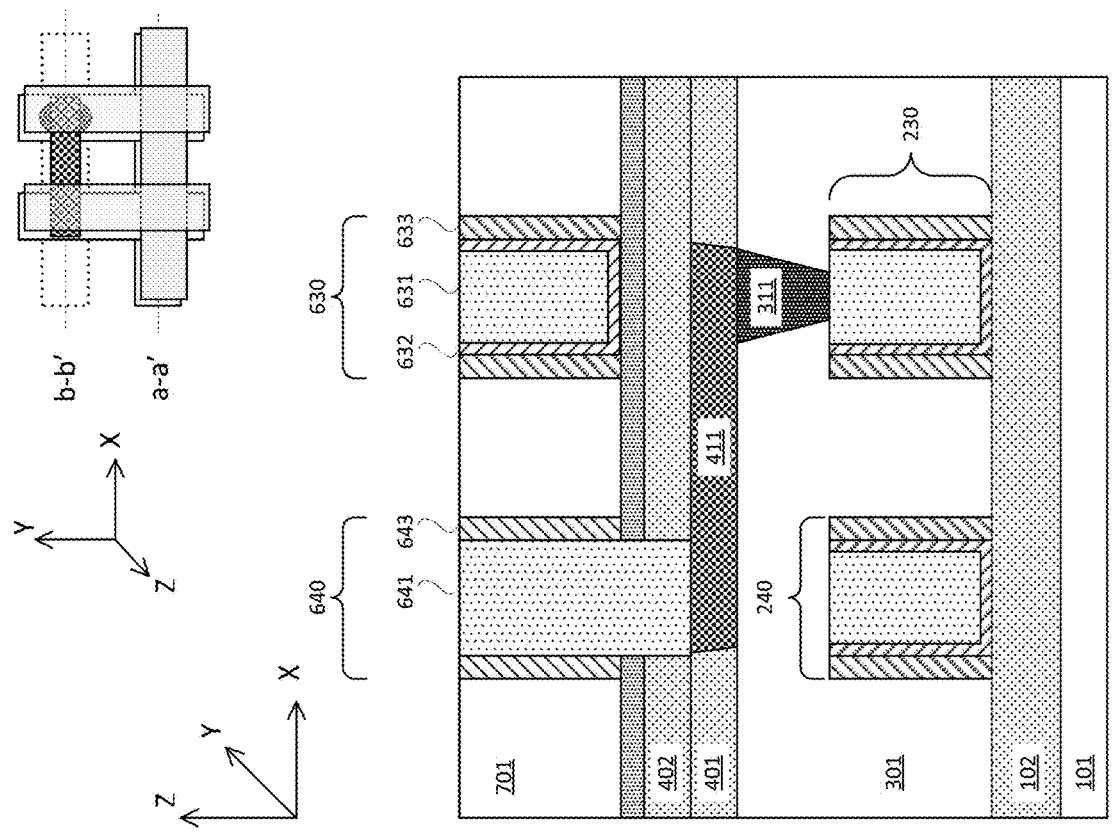
FIGS. 11A and 11B are demonstrative illustrations of cross-sectional views of a transistor structure in a step, following the step illustrated in FIGS. 10A and 10B, of manufacturing thereof according to one embodiment of present invention.
Figure 11A:
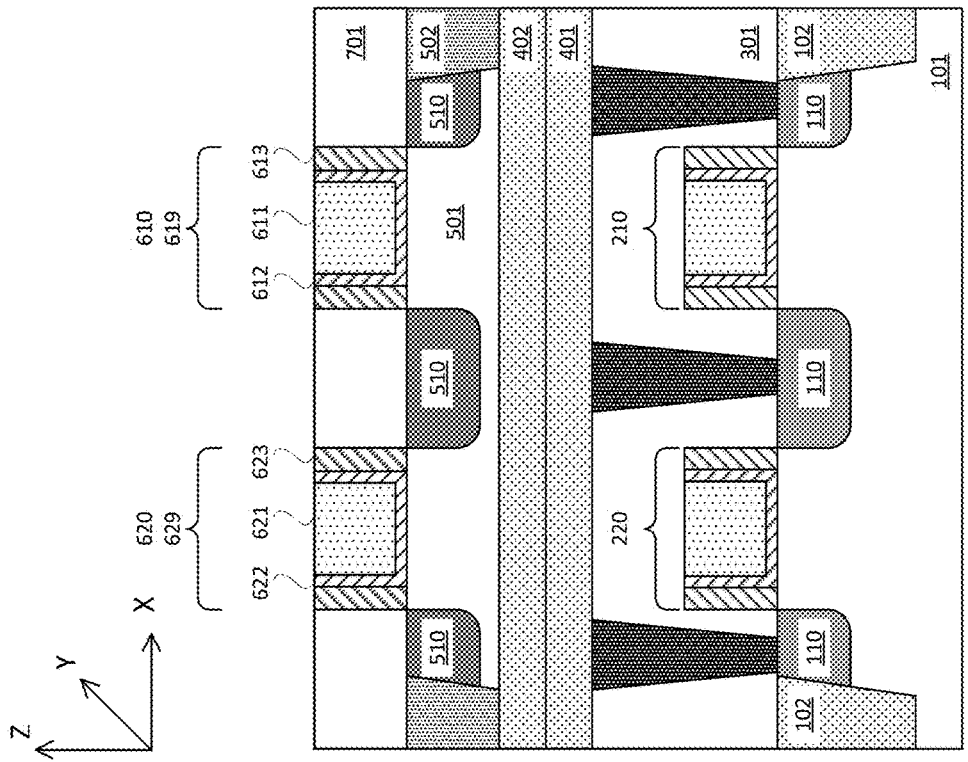

FIGS. 11A and 11B are demonstrative illustrations of cross-sectional views of a transistor structure in a step, following the step illustrated in FIGS. 10A and 10B, of manufacturing thereof according to one embodiment of present invention. More particularly, gate metal may be deposited into the openings between the sidewall spacers 613, 623, 633, and 643. Suitable gate metal material may include, for example, work-function metal (WFM) such as TiN, TiAlC, TiAl, TiC, etc. and optional conductive materials such as tungsten (W), cobalt (Co), ruthenium (Ru), and/or aluminum (Al), to name a few. The gate metal may be deposited to form a gate metal 611 of a first gate 610 of a first transistor 619 and a gate metal 621 of a second gate 620 of a second transistor 629 of the second transistor layer. The first transistor 619 and the second transistor 629 of the second transistor layer may be directly above the first transistor 219 and the second transistor 229 of the first transistor layer. At an extension of the first gate 610, off the channel region of the substrate 501, the conductive material may be deposited to form an extended gate structure 630 having a gate metal 631 that may be a same material as the gate metal 611. On the other hand, at an extension of the second gate 620, off the channel region of the substrate 501, the conductive material may be deposited to form a second local interconnect 640. The second local interconnect 640 may include a gate metal 641, which may be a same material as the gate metal 621, that connects to the metal routing layer 411. As is illustrated in FIG. 11B, the first local interconnect 311 and the second local interconnect 640 are at the two ends of the metal routing layer 411 and therefore do not vertically overlap with each other. In the meantime, the metal routing layer 411 does not overlap, vertically along the Z-direction, with the first transistor 619 and the second transistor 629. The metal routing layer 411 illustrated in FIG. 11B is separated, horizontally along the Y-direction, from the first and second transistors 619 and 629 illustrated in FIG. 11A.

After the deposition of conductive material to form the gate metals 611 and 621 and the second local interconnect 640, embodiments of present invention provide applying a chemical-mechanic-polishing (CMP) process to remove any excess conductive materials, as well as the gate dielectric layer 602, that are on top of the dielectric layer 701 to create a planarized top surface. The gate dielectric layer 602 may become the gate dielectric layer 612 of the first gate 610 of the first transistor 619 of the second transistor layer. The gate dielectric layer 612 may become the gate dielectric layer 632 in the extended gate structure 630. The gate dielectric layer 602 may become the gate dielectric layer 622 of the second gate 620 of the second transistor 629 of the second transistor layer.

Figures 12A, 12B:
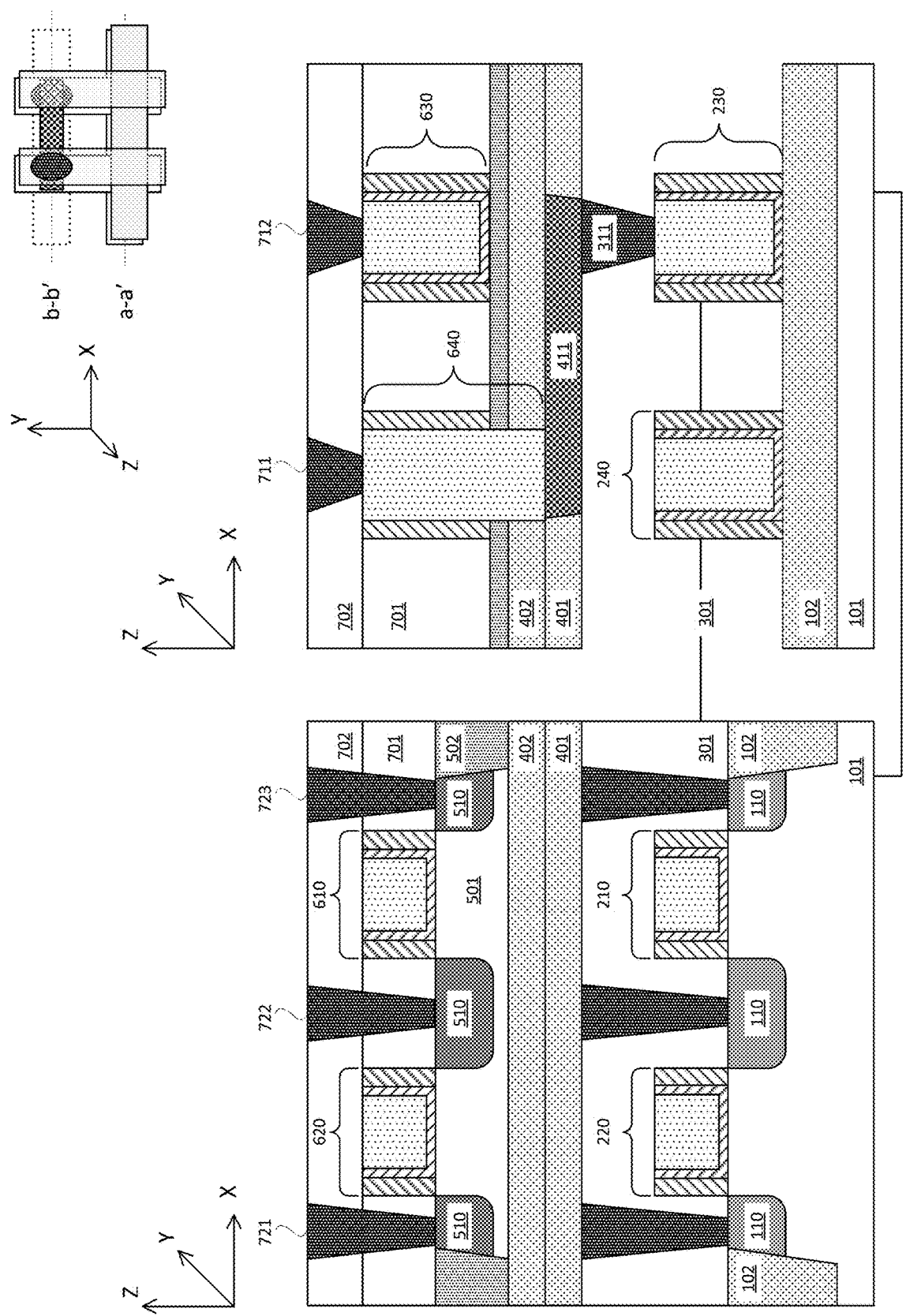
FIGS. 12A and 12B are demonstrative illustrations of cross-sectional views of a transistor structure in a step, following the step illustrated in FIGS. 11A and 11B, of manufacturing thereof according to one embodiment of present invention.

FIGS. 12A and 12B are demonstrative illustrations of cross-sectional views of a transistor structure in a step, following the step illustrated in FIGS. 11A and 11B, of manufacturing thereof according to one embodiment of present invention. More particularly, after forming the second local interconnect 640, embodiments of present invention provide forming a dielectric layer 702 covering the first and second transistors 619 and 629 of the second transistor layer as well as the second local interconnect 640. Conductive contacts such as source/drain contacts 721, 722, and 723, as well as gate contacts 711 and 712 to the first and second transistors 619 and 629 may be formed.

From the above, it becomes apparent that embodiments of present invention provide a cross-coupling structure that includes the first local interconnect 311, the metal routing layer 411, and the second local interconnect 640. The cross-coupling structure connects the first gate 210 of the first transistor 219 of the first transistor layer, which is a lower transistor layer, to the second gate 620 of the second transistor 629 of the second transistor layer, which is an upper transistor layer. It is also apparent that the second transistor 629 of the second transistor layer is not vertically directly above the first transistor 219 of the first transistor layer and is horizontally offset from the first transistor 219 of the first transistor layer.

Figure 13:
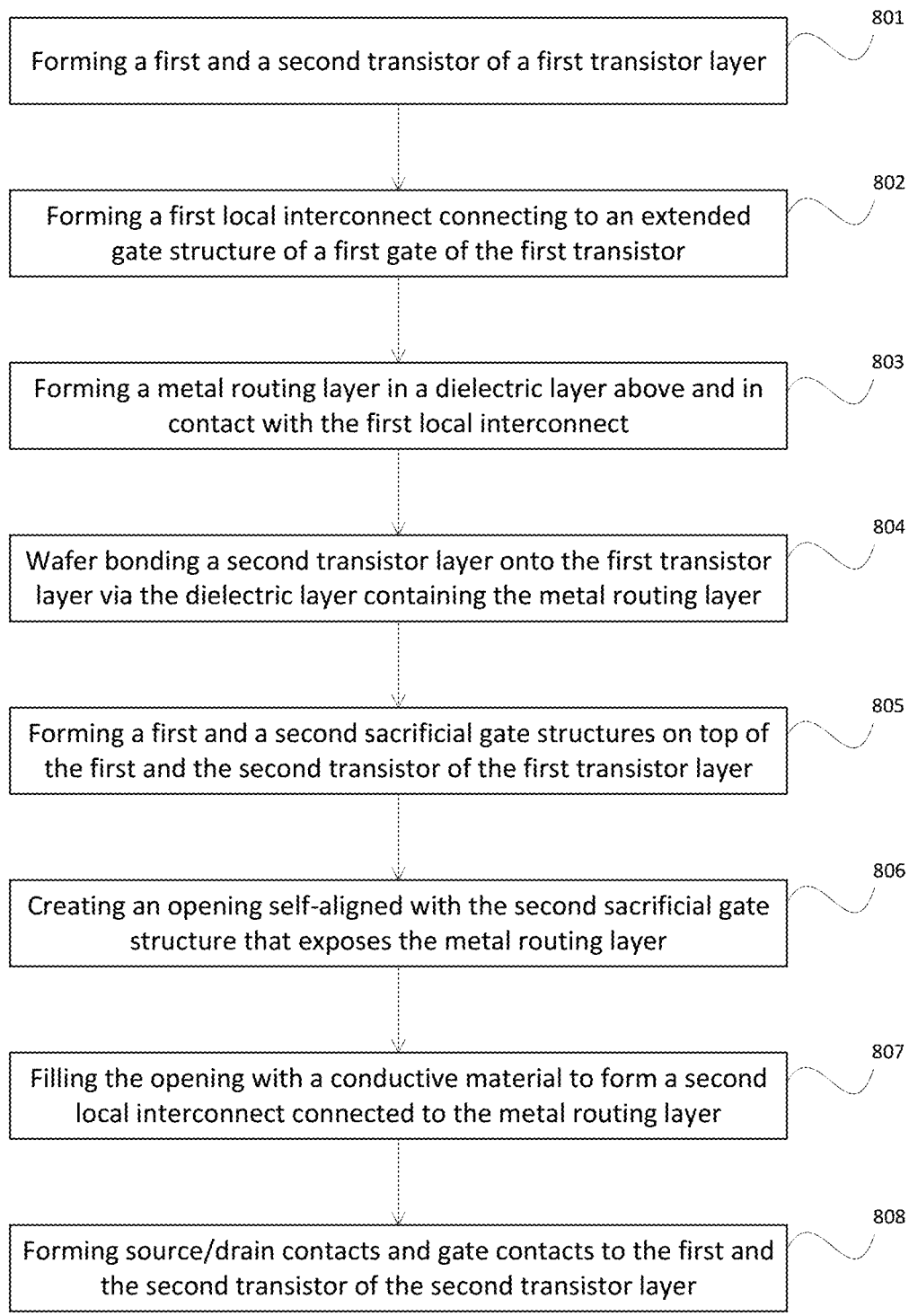
FIG. 13 is a demonstrative illustration of a flow-chart of a method of manufacturing a strained superlattice according to embodiments of present invention.

FIG. 13 is a demonstrative illustration of a flow-chart of a method of manufacturing a strained superlattice according to embodiments of present invention. The method includes (801) forming a first and a second transistor of a first transistor layer; (802) forming a first local interconnect that connects to an extended gate structure of a first gate of the first transistor; (803) depositing a dielectric layer on top of the first local interconnect and forming a metal routing layer in the dielectric layer, the metal routing layer being in contact with the first local interconnect; (804) wafer bonding a second transistor layer onto the first transistor layer, through an oxide bonding agent, via the dielectric layer that contains the metal routing layer; (805) forming a first and a second sacrificial gate structures on top of the first and the second transistor of the first transistor layer; (806) creating an opening at an extended region that is off the channel region of the second transistor of the second transistor layer, the opening being self-aligned to the second sacrificial gate structure and exposes the underneath metal routing layer; (807) filling the opening with a conductive material to form a second local interconnect, the second local interconnect connects to the metal routing layer; and (808) forming source/drain contacts and gate contacts to the first and the second transistor of the second transistor layer.

By the method of above, embodiments of present invention form the first local interconnect, the metal routing layer, and the second local interconnect that together form a cross-coupling structure. The cross-coupling structure connects the gate of the first transistor of the first transistor layer to the gate of the second transistor of the second transistor layer. The cross-coupling structure and in particular the metal routing layer situates between the first and second transistor layers, in a dielectric layer above the first transistor layer and underneath the oxide bonding layer that bond the second transistor layer to the first transistor layer.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A transistor structure comprising:
    a first transistor in a first transistor layer;
    a second transistor in a second transistor layer, the second transistor layer being above the first transistor layer and separated from the first transistor layer by an intermediate layer;
    a metal routing layer between the first transistor layer and the second transistor layer;
    a first local interconnect connecting the first transistor to the metal routing layer; and
    a second local interconnect connecting the metal routing layer to the second transistor,
    wherein, in a vertical direction from the second transistor to the first transistor, the metal routing layer and the first transistor do not cover each other, and the metal routing layer and the second transistor do not cover each other.

2. The transistor structure of claim 1, wherein the intermediate layer comprises a dielectric layer formed on top of the first transistor layer and an oxide bonding layer bonding the second transistor layer to the dielectric layer.

3. The transistor structure of claim 2, wherein the metal routing layer is embedded in the dielectric layer underneath the oxide bonding layer.

4. The transistor structure of claim 1, wherein the first local interconnect connects a gate metal of the first transistor to the metal routing layer, and the second local interconnect connects the metal routing layer to a gate metal of the second transistor, and wherein the second local interconnect does not vertically overlap with the first local interconnect.

5. The transistor structure of claim 1, wherein the second transistor is not vertically directly above the first transistor and is horizontally offset from the first transistor.

6. A method of forming a transistor structure comprising:
    forming a first transistor in a first transistor layer;
    forming a dielectric layer above the first transistor layer;
    forming a metal routing layer in the dielectric layer, the metal routing layer being connected to a gate metal of the first transistor;
    bonding a second transistor layer to the dielectric layer by an oxide bonding layer;
    forming a second transistor in the second transistor layer, a gate metal of the second transistor being connected to the metal routing layer,
    wherein, in a vertical direction from the second transistor to the first transistor, the metal routing layer and the first transistor do not cover each other, and the metal routing layer and the second transistor do not cover each other.

7. The method of claim 6, further comprising forming a first local interconnect contacting the gate metal of the first transistor in a region away from a channel region of the first transistor, the first local interconnect being in contact with the metal routing layer such that the metal routing layer being connected to the gate metal of the first transistor.

8. The method of claim 7, further comprising forming a second local interconnect in a region away from a channel region of the second transistor, the second local interconnect being self-aligned to a sidewall spacer of a gate of the second transistor.

9. The method of claim 8, further comprising forming the second local interconnect through the oxide bonding layer and the dielectric layer, the second local interconnect connects the gate metal of the second transistor to the metal routing layer.

10. The method of claim 9, wherein forming the second local interconnect comprises removing, in a region away from a channel region of the second transistor, a portion of the gate metal of the second transistor, and removing a gate dielectric layer lining sidewall spacers of the gate of the second transistor to create an opening.

11. The method of claim 10, further comprising removing a portion of the oxide bonding layer exposed by the opening, and a portion of the dielectric layer exposed by the removal of the oxide bonding layer on top thereof, to expose a portion of the metal routing layer.

12. The method of claim 11, further comprising depositing a gate metal on top of the exposed portion of the metal routing layer through the opening to form the second local interconnect.

13. The method of claim 7, wherein forming the metal routing layer in the dielectric layer comprises lithographically patterning an opening in the dielectric layer, the opening exposes the first local interconnect and extends to a region directly underneath a gate metal region of the second transistor.

14. A transistor structure comprising:
    a first and a second transistor in a first transistor layer;
    a first and a second transistor in a second transistor layer, respectively, above the first and the second transistor in the first transistor layer;

a metal routing layer between the first transistor layer and the second transistor layer, a first local interconnect connecting the first transistor of the first transistor layer to the metal routing layer; and a second local interconnect connecting the metal routing layer to the second transistor of the second transistor layer, wherein, in a vertical direction from the second transistor layer to the first transistor layer, the metal routing layer and the first transistor in the first transistor layer do not cover each other, and the metal routing layer and the second transistor in the second transistor layer do not cover each other.

15. The transistor structure of claim 14, wherein the first and second transistor layers are separated by an intermediate layer, the intermediate layer comprising a dielectric layer formed on top of the first transistor layer and an oxide bonding layer bonding the second transistor layer to the first transistor layer via the dielectric layer.

16. The transistor structure of claim 15, wherein the metal routing layer is embedded in the dielectric layer above the first transistor layer.

17. The transistor structure of claim 14, wherein the first local interconnect connects a gate metal of the first transistor of the first transistor layer to the metal routing layer, and the second local interconnect connects the metal routing layer to a gate metal of the second transistor of the second transistor layer.

18. The transistor structure of claim 17, wherein the first local interconnect is in a region away from a channel region of the first transistor of the first transistor layer, and the second local interconnect is in a region away from a channel region of the second transistor of the second transistor layer.

19. The transistor structure of claim 18, wherein the second local interconnect are formed within a sidewall spacer of a gate of the second transistor of the second transistor layer.

20. The transistor structure of claim 19, wherein at least a portion of the second local interconnect is in direct contact with the sidewall spacer of the gate of the second transistor of the second transistor layer.

* * * * *